United States Patent
Yachi et al.

[11] Patent Number: 5,889,357
[45] Date of Patent: *Mar. 30, 1999

[54] PIEZOELECTRIC OSCILLATION DEVICE AND SURFACE ACOUSTIC WAVE DEVICE

[75] Inventors: Masanori Yachi; Takashi Miyagawa; Takayuki Fujii; Masaaki Ono, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 568,125

[22] Filed: Dec. 6, 1995

[30] Foreign Application Priority Data

Apr. 10, 1995 [JP] Japan .................................. 7-084016

[51] Int. Cl.⁶ .................................................. H01L 41/08
[52] U.S. Cl. ...................... 310/344; 310/313 R; 310/348
[58] Field of Search ........................... 310/313 R, 313 B, 310/344, 348, 346; 361/301.4, 306.3, 321.2, 298.2; 357/295, 303

[56] References Cited

U.S. PATENT DOCUMENTS

| | | | |
|---|---|---|---|
| 3,969,640 | 7/1976 | Staudte | 310/344 |
| 4,012,700 | 3/1977 | Besson | 310/344 X |
| 4,266,156 | 5/1981 | Kizaki | 310/344 |
| 4,283,650 | 8/1981 | Koyama et al. | 310/344 |
| 4,450,377 | 5/1984 | Briese | 310/348 |
| 4,583,019 | 4/1986 | Yamada et al. | 310/348 X |
| 5,162,822 | 11/1992 | Wakamori | 310/348 X |
| 5,382,929 | 1/1995 | Inao et al. | 310/344 X |
| 5,430,345 | 7/1995 | Takahashi | 310/348 |
| 5,442,516 | 8/1995 | Montcrieff | 361/301.4 |
| 5,456,368 | 10/1995 | Onishi et al. | 310/313 R |
| 5,471,722 | 12/1995 | Yatsuda | 310/344 X |

FOREIGN PATENT DOCUMENTS

| | | |
|---|---|---|
| 0 127 442 | 12/1984 | European Pat. Off. |
| 01 078013 | 7/1989 | Japan |
| 59 178011 | 2/1995 | Japan |

OTHER PUBLICATIONS

Proceedings of the 38th Annual Frequency Control Symposium —Philadelphia, Pennsylvania, USA; May 19, 1984—Jun. 1, 1994; pp. 114–118 (XP002006284, Yuji Kojima et al.; Chip Crystal Resonator With Load Capacitors.

Primary Examiner—Mark O. Budd
Attorney, Agent, or Firm—Armstrong, Westerman, Hattori, McLeland & Naughton

[57] ABSTRACT

The substrate for devices 10 comprises an insulating substrate 12 of an insulating material, conducting layers 14 formed on the insulating substrate 12 and opposed to each other at a certain distance, and a dielectric film 16 formed on that portion of the insulating substrate 12 between the conducting layers 14. The substrate 10 incorporates a capacitance constituted by the opposed electric layers 14 and the dielectric film 16. A piezoelectric oscillator 20 is connected to the left and right conducting layers 14b, 14c of the substrate for devices 10. A cap 22 is connected to a boundary part of the substrate 10 through epoxy resin 24. The substrate for devices 10 with a built-in capacitance can reduce fabrication costs of a piezoelectric oscillation device and a surface acoustic wave device.

18 Claims, 11 Drawing Sheets

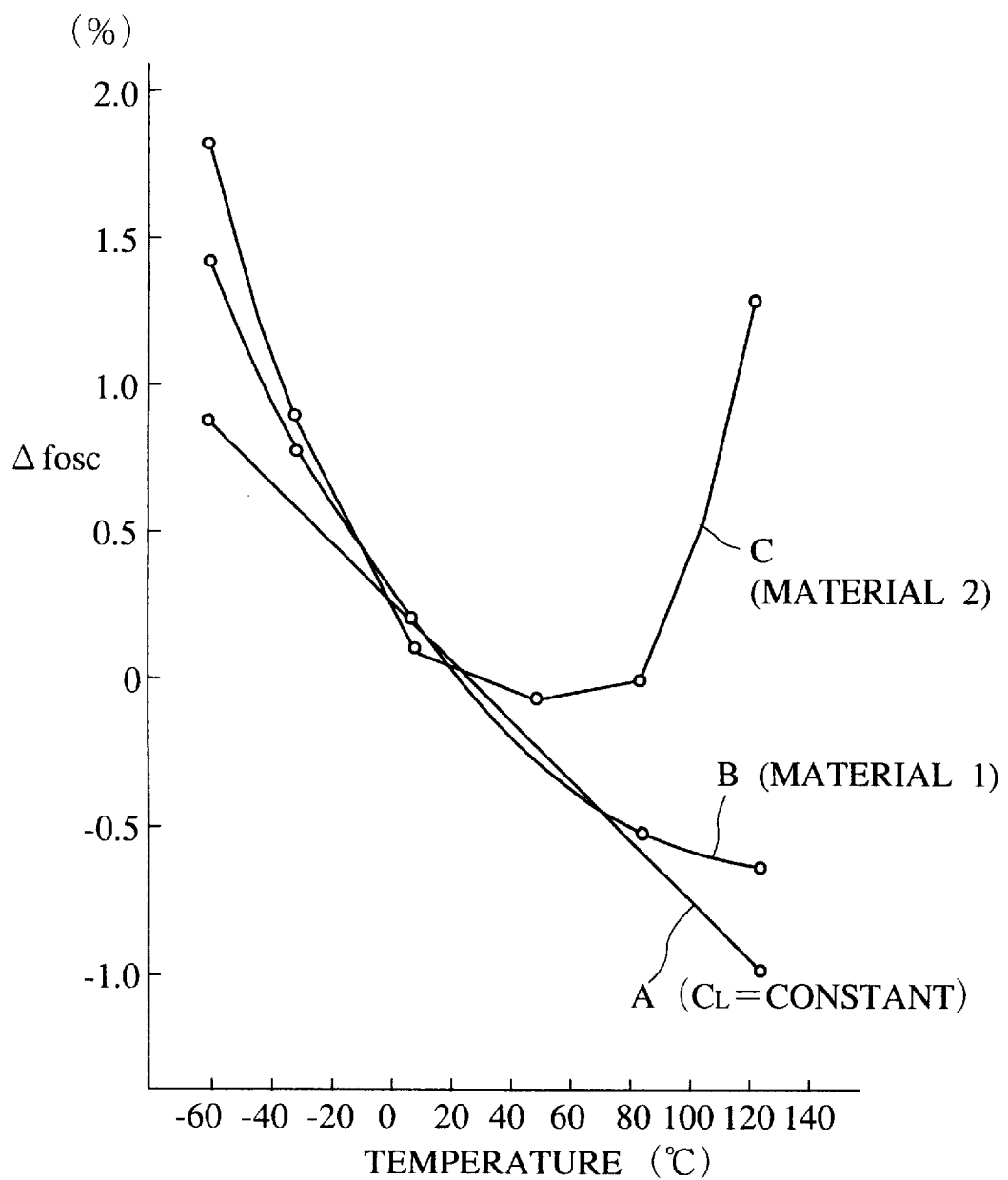

PIEZOELECTRIC OSCILLATION DEVICE AND SURFACE ACOUSTIC WAVE DEVICE

BACKGROUND OF THE INVENTION

The present invention relates to a piezoelectric oscillator device and a surface acoustic wave device.

The demand for smaller sizes and lower prices of electronic apparatuses has been becoming stronger recently. Electronic parts used in such electronic apparatuses are required to be smaller-sized and less expensive.

For example, to form an oscillation circuit with a piezoelectric oscillator, such as a quartz oscillator, which provides reference clock frequencies for electronic apparatuses, an amplifier, a condenser and a feedback resistor must be included in addition to the piezoelectric oscillator. These parts are separately formed and connected to each other to form the oscillation circuit.

Recently the amplifier and the feedback resistor for the oscillation circuit has been built in a microcomputer chip, and the piezoelectric oscillator and the condenser, which cannot be accommodated in the chip, are integrated with each other and connected to the chip as a single external part.

A piezoelectric oscillation device including a piezoelectric oscillator and a condenser integrated with each other as shown in FIG. 12 is known (Japanese Patent Laid-Open Publication Tokkaisho 59-178011(1984)).

The piezoelectric oscillation device of FIG. 12 comprises a lower electrode 51 of a paste of Ag, Ag·Pd or others formed on an alumina substrate 50, a dielectric film 52 of $SiO_2$ or others formed on the lower electrodes 51, and an upper electrode 53 of a paste of Ag, Age·Pd or others formed on the dielectric film 52. A piezoelectric oscillator 55 is connected to the upper electrode 53 through a bump 54 of a paste of Ag, Ag·Pd or others.

To form the lower electrode 51, the dielectric film 52 and the upper electrode 53, the conventional piezoelectric oscillation device of FIG. 12 requires the step of applying and annealing the paste for formation of each layer. In addition, the single layer dielectric film 52 is not sufficient to provide the required characteristics because of a number of voids and holes, and the dielectric film must have at least two layers. Although not shown in FIG. 12, to mount the piezoelectric oscillation device on the surface of a circuit substrate, it is necessary to also form a connection electrode on the underside of the alumina substrate 50.

To form the conventional piezoelectric oscillation device, the application and annealing step is conducted once for the formation of the lower electrode 51, and repeated twice for the formation of the dielectric film 52, once for the formation of the dielectric film 52 and once for the formation of the connection electrode. Thus, this step must be conducted five times. This has added to fabrication costs and has been a barrier to lower product prices.

It is proposed to provide a interdigital electrode on the surface of a dielectric substrate to form a condenser. To obtain the required capacitance, the dielectric substrate must be formed of a dielectric material having a high dielectric constant. Dielectric materials having high dielectric constants do not have sufficient strength, which is necessary technical consideration, for example, adhering the dielectric substrate to a substrate having a sufficient strength. This has added to fabrication costs and has been a barrier to lower part prices.

SUMMARY OF THE INVENTION

An object of the present invention is to provide a piezoelectric vibration apparatus which can keep fabrication costs low and prices low.

Another object of the present invention is to provide a surface acoustic wave device which can keep fabrication costs low and prices low.

The above-described objects are achieved by a piezoelectric oscillation device comprising: an insulating substrate; conducting layers formed on the insulating substrate and opposed to each other at such a distance that the conducting layers are insulated from each other; a dielectric film formed on that portion of the insulating substrate so as to cover at least a portion of the conducting layers and having a higher dielectric constant than the insulating substrate; and a piezoelectric oscillator connected to the conducting layers, whereby the opposed conducting layers and the dielectric film constitute a capacitance.

The above-described objects are achieved by a surface acoustic wave device comprising: an insulating substrate; conducting layers formed on the insulating substrate and opposed to each other at such a distance that the conducting layers are insulated from each other; a dielectric film formed on that portion of the insulating substrate so as to cover at least a portion of the conducting layers and having a higher dielectric constant than the insulating substrate; and a surface acoustic wave device chip connected to the conducting layers, whereby the opposed conducting layers and the dielectric film constitute a capacitance.

It is preferred that said piezoelectric oscillation device further comprises conducting layers of a predetermined length for inductance formed on the insulating substrate and connected to said conducting layers.

It is preferred that said surface acoustic wave device further comprises conducting layers of a predetermined length for inductance formed on the insulating substrate and connected to said conducting layers.

It is preferred that a dielectric constant of the dielectric film is above 50.

It is preferred that a Curie point of the dielectric film is near room temperature.

It is preferred that the conducting layers includes a plurality of pairs of electrode layers opposed to each other at a certain distance, and a connection layer which commonly connects the electrode layers of said plurality of pairs; the dielectric film is formed so that connections between the said plurality of electrode layers and the connection layer are not covered by the dielectric film; and said capacitance is adjustable by cutting off some of the connections between said plurality of pairs of electrode layers and the connection layer.

As described above, the piezoelectric oscillation device according to the present invention comprises an insulating substrate, conducting layers formed on the insulating substrate and opposed to each other at such a distance that the conducting layers are insulated from each other, a dielectric film formed on that portion of the insulating substrate so as to cover at least a portion of the conducting layers and having a higher dielectric constant than the insulating substrate, and a piezoelectric oscillator connected to the conducting layers, the opposed conducting layers and the dielectric film constituting a capacitance, whereby the substrate can have a capacitance built in and can have low fabrication costs.

The above-described piezoelectric oscillation device additionally includes conducting layers for inductances of a set length which are formed on the insulating substrate and connected to the conducting layers, whereby the piezoelectric oscillation device can incorporate an inductance as well as a capacitance.

The above-described piezoelectric oscillation device can provide electronic parts having little characteristic changes due to temperature characteristics when a Curie point of the dielectric film is near room temperature.

The above-described piezoelectric oscillation device includes the conducting layer having a plurality of pairs of the electrode layers opposed to each other at a certain distance and the connection layer which commonly connects to said plurality of the electrode layers, and the dielectric layers which do not cover the connections between said plurality of the electrode layers and the connection layer, so that connections exposed, not covered with the dielectric film can be cut off, whereby the capacitance is changed to adjust characteristics of electronic parts.

As described above, the surface acoustic wave device according to the present invention comprises an insulating substrate, conducting layers formed on the insulating substrate and opposed to each other at such a distance that the conducting layers are insulated from each other, a dielectric film formed on that portion of the insulating substrate so as to cover at least a portion of the conducting layers and having a higher dielectric constant than the insulating substrate, and a piezoelectric oscillator connected to the conducting layers, the opposed conducting layers and the dielectric film constituting a capacitance, whereby the substrate can have a capacitance built in and can have low fabrication costs.

The above-described surface acoustic wave device additionally includes conducting layers for inductances of a set length which are formed on the insulating substrate and connected to the conducting layers, whereby the surface acoustic wave device can incorporate an inductance as well as a capacitance.

The above-described surface acoustic wave device can provide electronic parts having little characteristic changes due to temperature characteristics when a Curie point of the dielectric film is near room temperature.

The above-described surface acoustic wave device includes the conducting layer having a plurality of pairs of the electrode layers opposed to each other at a certain distance and the connection layer which commonly connects to said plurality of the electrode layers, and the dielectric layers which do not cover the connections between said plurality of the electrode layers and the connection layer, so that connections exposed, not covered with the dielectric film can be cut off, whereby the capacitance is changed to adjust characteristics of electronic parts.

BRIEF DESCRIPTION OF THE DRAWINGS

FIG. 5 is a graph of temperature characteristics of the oscillation frequency of the piezoelectric oscillation device according to the embodiment of FIG. 1.

DETAILED DESCRIPTION OF THE INVENTION

Figure 1:
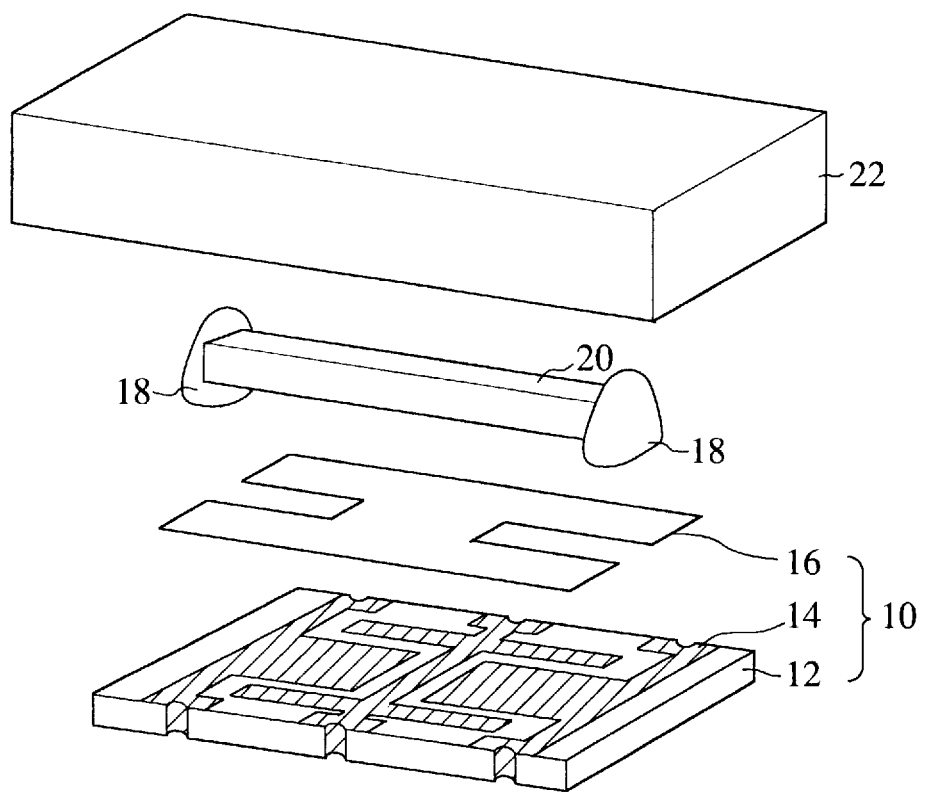
FIG. 1 is a broken perspective view of the piezoelectric oscillation device according to one embodiment of the present invention.
Figure 2:
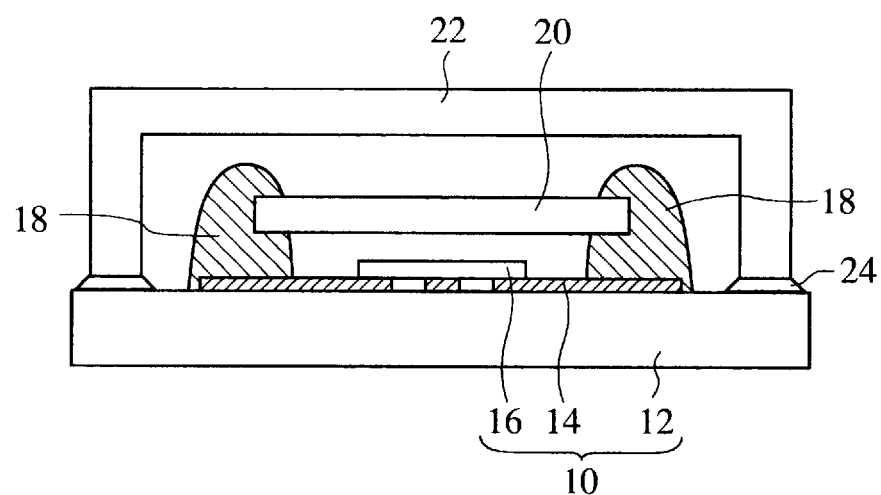
FIG. 2 is a sectional view of the piezoelectric oscillation device according to the embodiment of FIG. 1.
Figure 3:
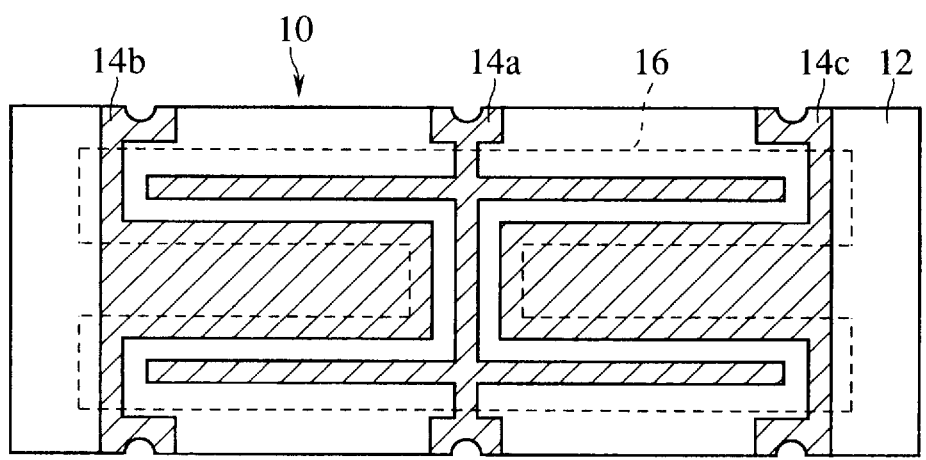
FIG. 3 is a plan view of the substrate for devices used in the piezoelectric oscillation device according to the embodiment of FIG. 1.

The piezoelectric oscillator device according to one embodiment of the present invention will be explained with reference to FIGS. 1 to 9. FIG. 1 is a broken perspective view of the piezoelectric oscillation device according to the present embodiment. FIG. 2 is a sectional view of the piezoelectric oscillation device according to the present embodiment. FIG. 3 is a plan view of the substrate for devices which is used in the piezoelectric oscillation device according to the present embodiment.

The substrate for devices 10 which is used in the piezoelectric oscillation device according to the present embodiment comprises an insulating substrate 12 of an insulating material, a conducting layer 14 formed on the insulating substrate 12, and a dielectric film 16 formed on the conducting layer 14.

Materials of the insulating substrate 12 can be any insulating materials which have sufficient strength. Such materials are exemplified by alumina ($Al_2O_3$: dielectric constant= 10), forsterite ($2MgO \cdot SiO_2$: dielectric constant=7), aluminium nitride (AlN: dielectric constant=9), steatite ($MgO \cdot SiO_2$: dielectric constant=8), mulite ($3Al_2O_3 \cdot 2SiO_2$: dielectric constant=7), etc.

The conducting layer 14 is formed on the insulating substrate 12 in a required pattern. As shown in FIG. 3, according to the present embodiment, an H-shaped conducting layer 14a is formed at the center, and T-shaped conducting layers 14b, 14c are formed opposed to each other on both sides of the H-shaped conducting layer 14a. The conducting layer 14 is formed of any conducting material, and the conducting material is exemplified by Ag, Ag·Pd, Ag·Pt, or others.

A conducting layer (not shown) is also formed on the backside of the insulating substrate 12.

The dielectric film 16 is formed in a pattern which covers the parts of the insulating substrate 12 between the conducting layer 14a at the center, and the left and right conducting layers 14b, 14c.

In the present embodiment, as shown in FIG. 3, the dielectric film 16 is formed in an H-shaped pattern which covers the parts of the insulating substrate 12 between the central conducting layer 14a, and the left and right conducting layers 14b, 14c, but does not cover the parts of the insulating substrate 12 at the centers of the left and the right conducting layers 14b, 14c. The central parts of the left and right conducting layers 14b, 14c are not covered so that piezoelectric oscillators of different sizes, which will be described later, can be accommodated. The insulating substrate 12 is exposed at the center parts of the left and right conducting layers 14b, 14c so that piezoelectric oscillators of small sizes can be accommodated.

The dielectric film 16 functions as a protective film for the conducting layer 14 formed on the insulating substrate 12.

It is preferred that the dielectric film 16 is formed of a high dielectric constant material. Such a material is exemplified by barium titanate ($BaTiO_3$:dielectric constant=75–1500), lead titanate ($PbTiO_3$:dielectric constant=20–200), strontium titanate ($SrTiO_3$:dielectric constant=20–100), etc.

The thus-formed substrate for devices 10 includes a PZT film of a 20 $\mu$m thickness as the dielectric film 16, and can incorporate a capacitance 4 of about 20 pF with the pattern as shown.

A piezoelectric oscillator 20 is connected to the left and right conducting layers 14b, 14c of the substrate 10 through bumps 18 of a paste of Ag, Ag·Pd, or others. The piezoelectric oscillator 20 is provided by a quartz oscillator, ceramic oscillator or an oscillator of a piezoelectric monocrystal, such as $LiNbO_3$, $LiTaO_3$, or others.

A cap 22 is connected to a boundary part of the upper surface of the substrate 10 through epoxy resin 24. The cap 22 is formed of, e.g., alumina ceramics ($Al_2O_3$) or highly heat resistant plastics.

Thus according to the present embodiment, the insulating substrate has sufficient strength to be used alone without being bonded to another substrate having strength. Furthermore, only the dielectric film is formed between the opposed conducting layers on the insulating substrate, and in forming the piezoelectric oscillator device, only three steps of application and annealing are required for forming the conducting layer on the insulating substrate, the dielectric film on the conducting layer, and the conducting layer on the underside of the insulating substrate. This results in low fabrication costs and low prices. In addition, central parts of the left and the right conducting layers are exposed, whereby the substrate for devices may be commonly used in piezoelectric oscillators of different sizes. This commonability of use of the part can realize low prices of the piezoelectric oscillator.

Figure 4A:
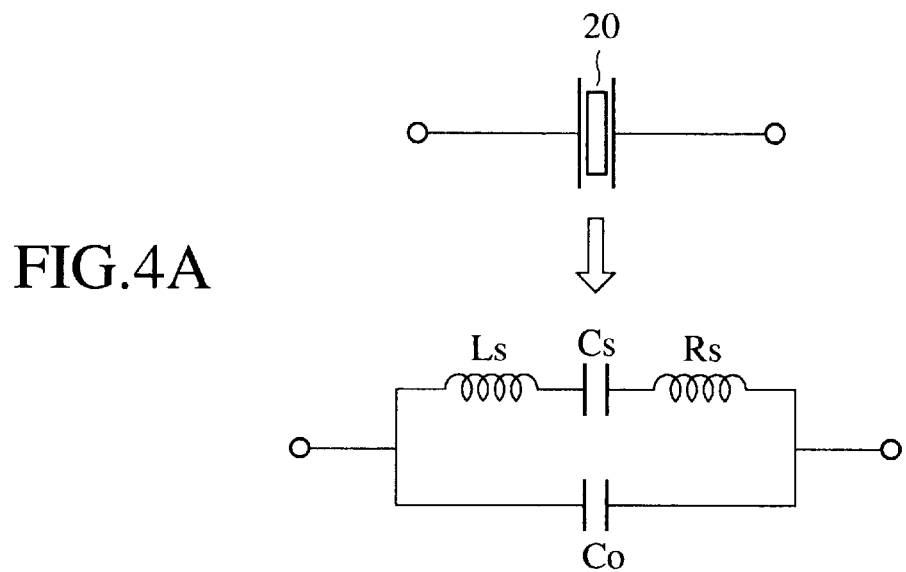
FIG. 4A is a view of an equivalent circuit of a piezoelectric oscillator.
Figure 4B:
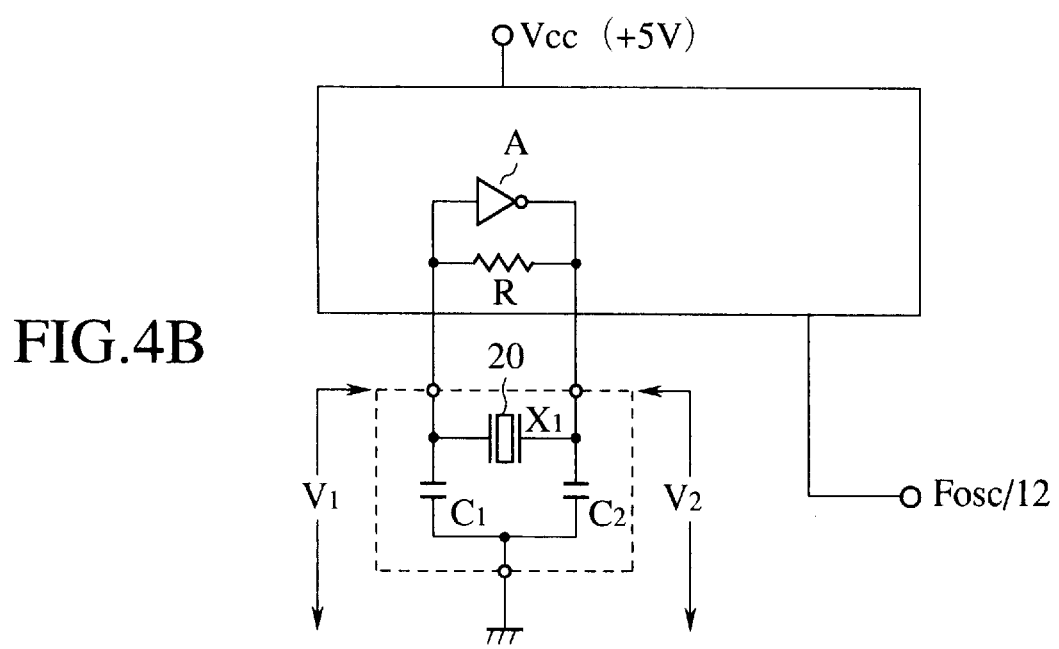
FIG. 4B is a view of a circuit of a typical oscillation circuit.
Figure 6:
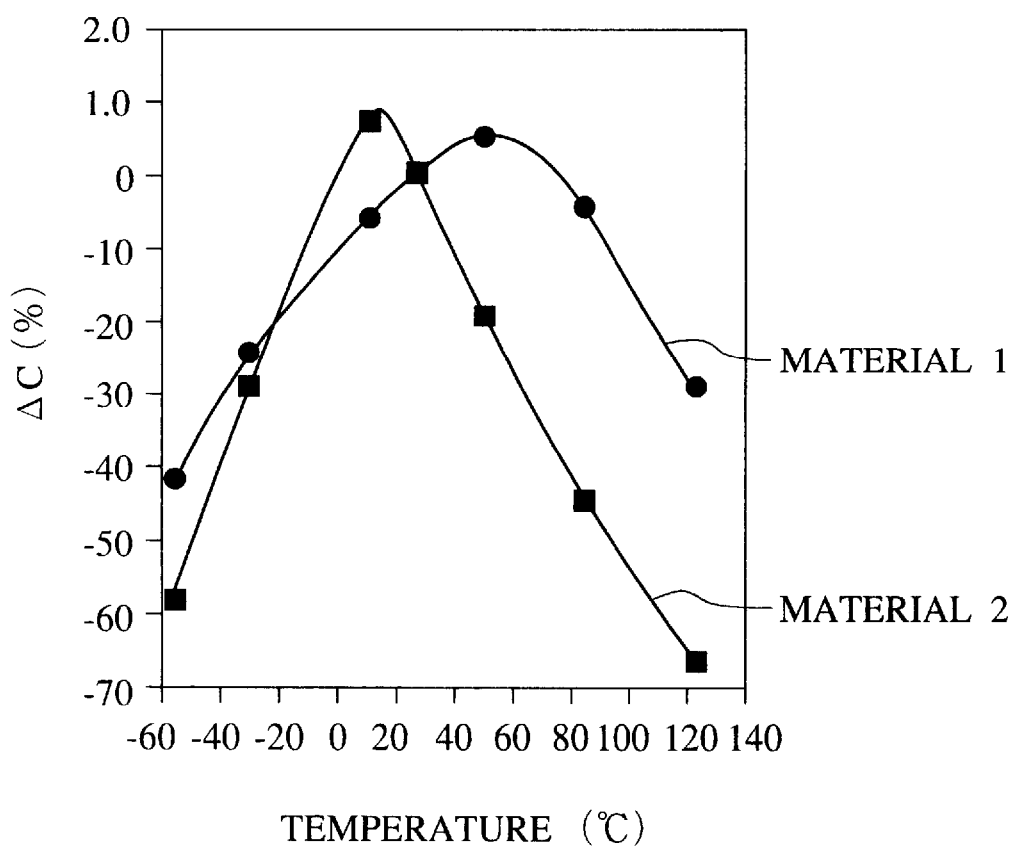
FIG. 6 is a graph of temperature characteristics of the capacitance built in the piezoelectric oscillation device according to the embodiment of FIG. 1.

Next, a method of improving temperature characteristics of the oscillation frequencies of the piezoelectric oscillation device according to the present embodiment will be explained with reference to FIGS. 4A to 6. FIG. 4A shows a circuit equivalent to the piezoelectric oscillator and FIG. 4B shows a typical oscillation circuit. FIG. 5 shows temperature characteristics of the oscillation frequencies. FIG. 6 shows the temperature characteristics of the capacitance built into the piezoelectric oscillation device.

The equivalent circuit of the piezoelectric oscillator, and the typical oscillation circuit will be explained.

FIG. 4A shows the equivalent circuit of the piezoelectric oscillator 20. The equivalent circuit of the piezoelectric oscillator circuit 20 is represented by a series circuit having an inductance Ls, a condenser Cs and a resistor Rs, and a condenser Co which is in parallel with the serial circuit.

FIG. 4B is a typical oscillation circuit. Both ends of the piezoelectric oscillator 20 are grounded through condensers C1, C2. The condensers C1, C2 respectively correspond to capacitances which are formed respectively by the central conducting layer 14a and each of the left and the right conducting layers 14b, 14c. An amplifier A and a resistor R are paralelly connected to the piezoelectric oscillator 20. The part enclosed by the broken line in FIG. 4b is the circuit of the piezoelectric oscillation device according to the present embodiment.

A deviation $\Delta fosc$ of an oscillation frequency in the case that the piezoelectric oscillator 20 represented by the equivalent circuit of FIG. 4a is used in the oscillation circuit of FIG. 4b is expressed by the following formula:

$$\Delta fosc = k \times [\tfrac{1}{2}\gamma + 1/\{1+(CL/Co)\}]$$

wherein:
k=proportional constant
$\gamma$=Co/Cs
CL=C1×C2/(C1+C2)

Here the piezoelectric oscillator 20 is provided by 165° Y-cut $LiNbO_3$. A frequency on the conditions: room temperature (20° C.); $\gamma$=5; and CL/Co=10 was selected as an initial value of the oscillation frequency fosc. A ratio fosc/fr of the oscillation frequency fosc to the oscillation frequency fr in this initial state is 1.00908 (0.908%)

When it is assumed under these conditions that a capacitance C1, i.e., a capacitance of the incorporated condensers C1, C2, is constant with respect to temperature changes, as shown in FIG. 5, deviations $\Delta fosc$ of an oscillation frequency are changed by temperature characteristics of the materials of the piezoelectric oscillator 20. The curve A in FIG. 5 indicates such changes. When the temperature increases, the oscillation frequency deviation $\Delta f$ is linearly decreased.

The inventors of the present application have obtained the idea of correcting oscillation frequency deviations $\Delta fosc$, which exhibit the characteristic that they linearly decrease with temperature increases, by the use of the temperature characteristics of dielectric materials.

It is known that highly dielectric materials have Curie points, and their dielectric constants decrease with temperature changes. The above-described capacitance CL is a composite capacitance, made up of capacitances C1 and C2 of the piezoelectric oscillation device. Accordingly a capacitance CL which is a composite capacitance of capacitances C1 and C2 of a highly dielectric material also increases and decreases proportionally with dielectric constant increases and decreases.

Here, based on the above-described formula, it is seen that increases of the capacitance CL act to decrease an oscillation frequency deviation $\Delta fosc$, and decreases of the capacitance CL act to increase an oscillation frequency deviation $\Delta fosc$.

Accordingly, decrease in a capacitance CL will correct decrease in oscillation frequency deviation. Based on this technical presumption, oscillation frequency deviations $\Delta fosc$ were measured by using different highly dielectric materials.

First, Material 1 "PZT" (composition ratio of 48 mol % of $PbZrO_3$ and 52 MOL % OF $PbTiO_3$) was used as a highly dielectric material. The Curie point of Material 1 is about 50° C. As indicated by the curves of FIG. 6, Material 1 has the temperature characteristic that the peak capacitance deviation $\Delta C$ is at a Curie point of about 10° C. In this case, as indicated by Curve C in FIG. 5, correction of the decrease in the oscillation frequency deviation $\Delta fosc$ is effective above about 10° C. From about 0° C. to about 90° C. the oscillation frequency deviation $\Delta fosc$ is substantially zero. Much improvement was found.

Thus according to the present embodiment, by selecting a highly dielectric material, oscillation frequency deviations in the usually used temperature range can be improved.

In the present embodiment, the conducting layer 14 and the dielectric film 16 have the patterns shown in FIG. 3 but may have different patterns. The different patterns are exemplified in FIGS. 7 to 9.

Figure 7:
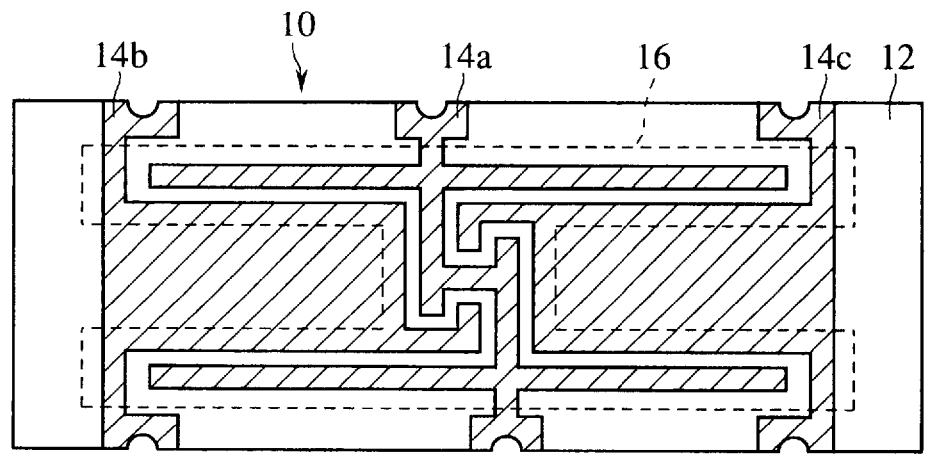
FIG. 7 is a plan view of a different pattern of the substrate for devices used in the piezoelectric oscillation device according to the present invention.

In the pattern of FIG. 7 the left and the right conducting layers 14b, 14c are mated at the center of the central conducting layer 14a, so that the conducting layers have a greater quantity of opposed regions. This can result in larger values of the incorporated capacitance. In the pattern of FIG. 7, the dielectric film 16 does not cover central parts of the left and the right conducting layers 14b, 14c so that dielectric oscillators of different sizes can be accommodated.

Figure 8:
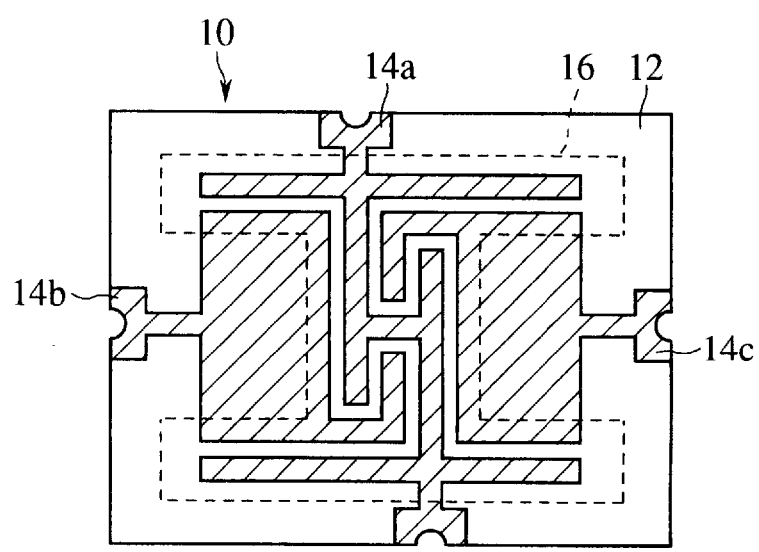
FIG. 8 is a plan view of a different pattern of the substrate for devices used in the piezoelectric oscillation device according to the present invention.

In the pattern of FIG. 8 as well as that of FIG. 7, the left and the right conducting layers 14b, 14c are mated at the center of the central conducting layer 14a, so that the conducting layers have a greater quantity of opposed regions, and a connection conducting layer for connection with circuit substrates can be allowed to be formed on four sides of the insulating substrate 12. In the pattern of FIG. 8 as well, central parts of the left and the right conducting layers 14b, 14c are not covered by the dielectric film 16 so that piezoelectric oscillators of different sizes can be accommodated.

Figure 9A:
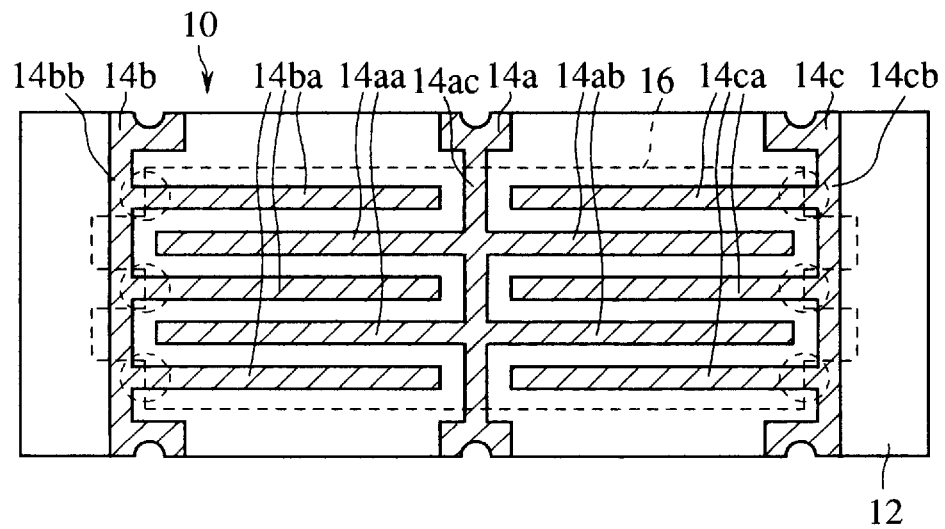
FIGS. 9A and 9B are plan views of a different pattern of the substrate for devices used in the piezoelectric oscillation device according to the present invention.

In the pattern of FIG. 9A, the central conducting layer 14a, and the left and the right conducting layers 14b, 14c are formed in interdigital electrodes, so that a maximum values of the incorporated capacitance can be obtained. The central conducting layers 14a includes interdigital electrode layers 14aa, 14bb which are projected left and right, and a connection layer 14ac which is commonly connected to the interdigital electrode layers 14aa, 14ab. The left conducting layer 14b includes interdigital electrode layers 14ba which are projected right, and a connection layer 14bb which is commonly connected to the interdigital electrode layers 14ba. The right conducting layer 14c includes interdigital electrode layers 14ca which are projected left, and a connection layer 14cb which is commonly connected to the interdigital electrode layers 14ca.

In the pattern of FIG. 9A, the dielectric film 16 does not cover the entire surface of the central conducting layer 14a, and the left and the right conducting layers 14b, 14c, i.e., the connections (circled in FIG. 9A) between the left and the right conducting layers 14b, 14c, and the interdigital electrode layers 14ba, 14ca.

Figure 9B:
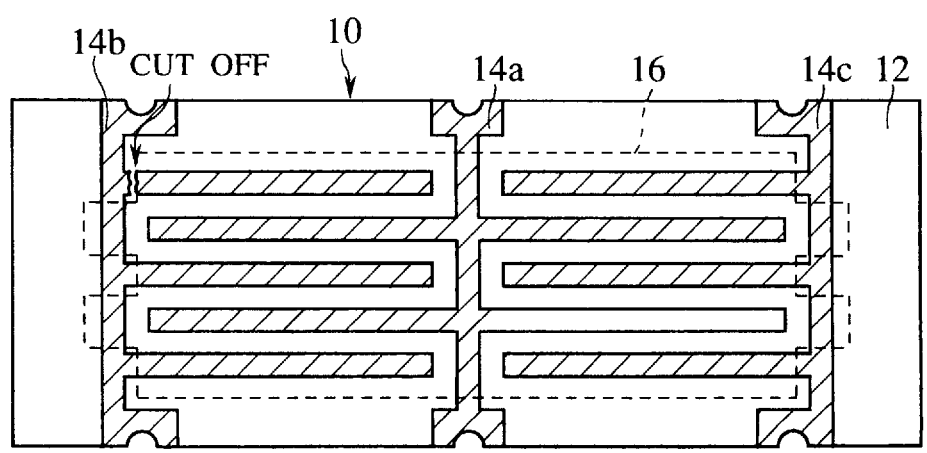

This pattern permits a value of the incorporated capacitance of the device substrate as fabricated to be changed so as to adjust oscillation frequencies of the piezoelectric device. After the piezoelectric device has been fabricated, laser beams are irradiated as to the parts circled in FIG. 9A to cut off the connections and separate the parts of the interdigital electrode layers as shown in FIG. 9B, whereby the value of the incorporated capacitance is changed to adjust oscillation frequencies. For example, a piezoelectric device is designed to have a little lower oscillation frequency, and after fabrication, the required connections are cut off so that the piezoelectric device precisely has a required oscillation frequency.

Figure 10A:
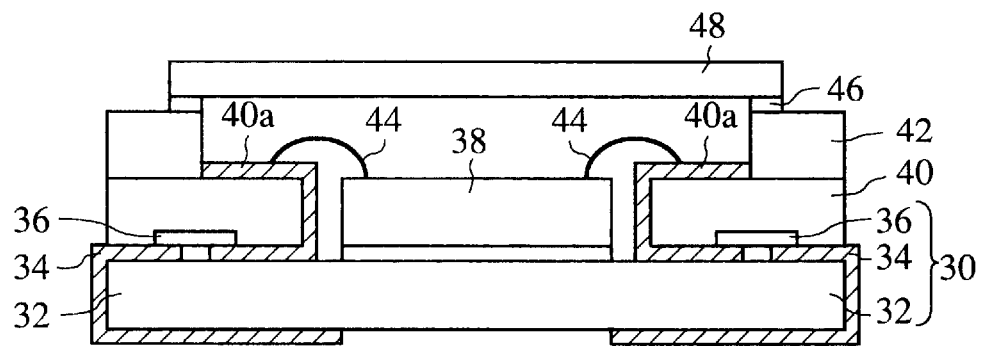
FIGS. 10A and 10B are views of the surface acoustic wave device according to another embodiment of the present invention.
Figure 10B:
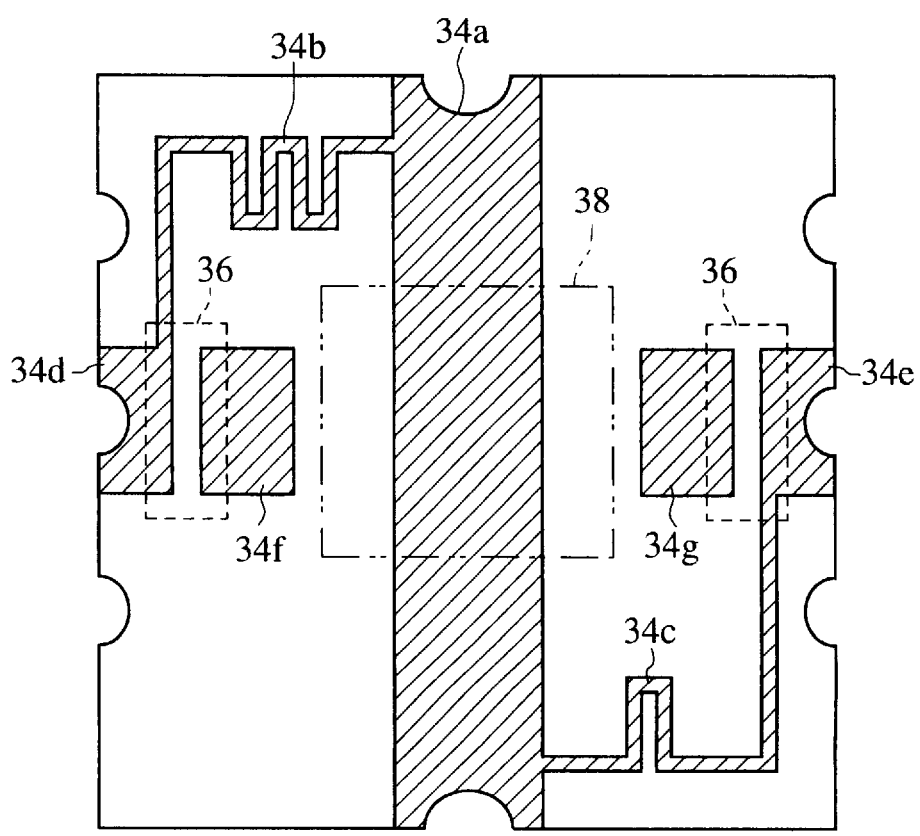
Figure 11:
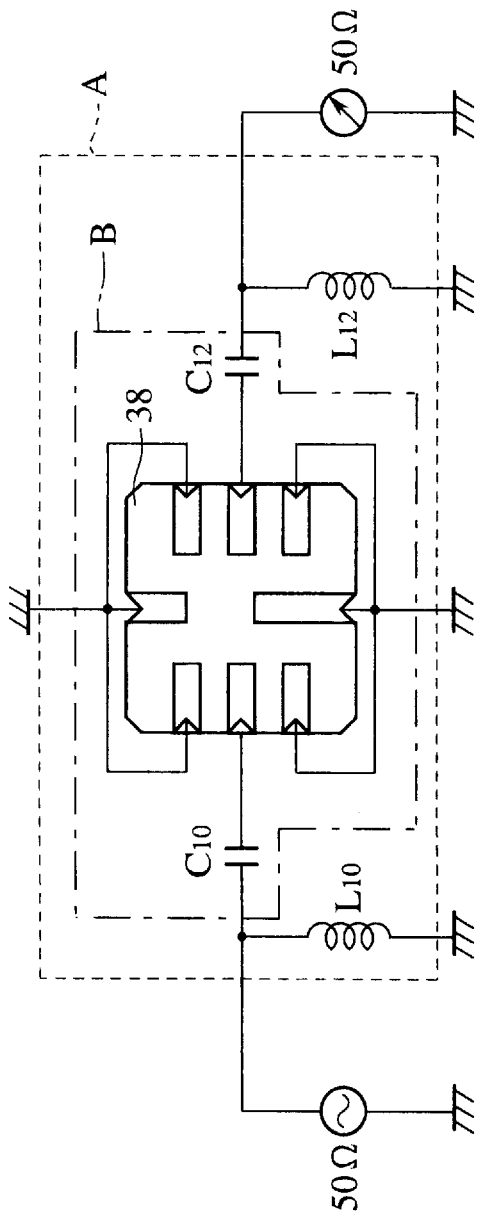
FIG. 11 is a view of a filter circuit using the surface acoustic wave device according to the embodiment of FIGS. 10A and 10B.
Figure 12:
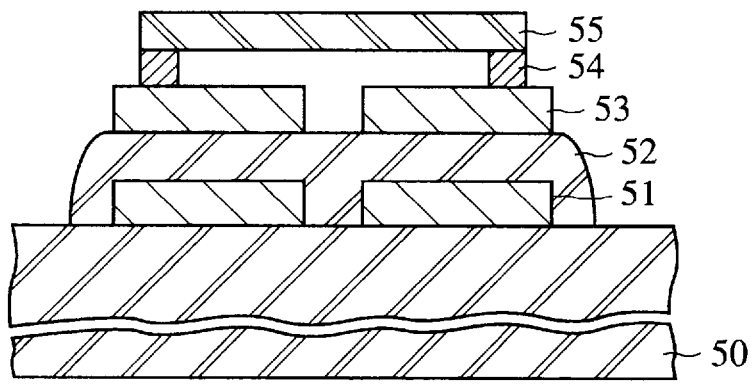
FIG. 12 is a sectional view of the conventional piezoelectric oscillation device.

The surface acoustic wave device according to another embodiment of the present invention will be explained with reference to FIGS. 10A, 10B and 11. In the surface acoustic wave device according to the present embodiment, the substrate for devices used in the above-described embodiment is applied to the surface acoustic wave device. FIG. 10A is a sectional view of the surface acoustic wave device according to the present embodiment, and FIG. 10B is a plan view of the substrate for devices. FIG. 11 is a view of a filter circuit using the surface acoustic wave device according to the present invention.

The substrate for devices 30 according to the present embodiment which is applied to a surface acoustic wave device comprises, as shown in FIG. 10A, an insulating substrate 32 of an insulating material, a conducting layer 34 formed on the insulating substrate 32, and a dielectric film 36 formed on the conducting layer 34.

The substrate for devices 30 itself includes the conducting layer 34 patterned as shown in FIG. 10B, and the dielectric film 36, which are formed on the insulating substrate 32. That is, the conducting layer 34 includes an earth layer 34a formed at the center, and inductance layers 34b, 34c which are respectively formed bent on both sides and connected to connection layers 34d, 34e for connection to circuit substrates. Conducting layers 34f, 34g are formed opposed to the connection layers 34d, 34e.

The dielectric film 36 is formed so as to cover parts of the connection layer 34d and of the conducting layer 34f which are opposed to each other, and parts of the connection layer 34e and of the conducting layer 34g which are opposed to each other.

The substrate for devices 30 according to the present embodiment incorporates an inductance provided by the inductance layers 34b, 34c, and a capacitance provided by the connection layers 34d, 34c, the conducting layers 34f, 34g and the dielectric film 36.

A surface acoustic wave device 38 is mounted on the center of the substrate for devices 30, and ceramic layers 40, 42 are formed the former on the latter, surrounding the surface acoustic wave device 38. A conducting layer 40a is formed on the upper surface of the ceramic layer 40 which is connected to the surface acoustic wave device by a wire 44.

A cap 48 is secured to the upper surface of the ceramic layer 40 through epoxy resin.

A filter circuit using the surface acoustic wave device according to the present embodiment is shown in FIG. 11. The filter circuit requires condensers C10, C12, and inductances L10, L12 as a matching circuit for the surface acoustic wave device 38. The surface acoustic wave device according to the present embodiment incorporated in the filter circuit is within the region A enclosed by the broken line in FIG. 11.

It is possible that the surface acoustic wave device of FIGS. 10A and 10B with the inductance layers 34b, 34c omitted is incorporated in the filter circuit within the region B enclosed by the long-short dashed line in FIG. 11.

According to the present embodiment, the matching circuit required for the filter circuit can be incorporated in the surface acoustic wave device, which can realize down-sizing and low prices of the device.

The present invention is not limited to the above-described embodiments and includes other variations and modifications.

For example, the substrate for devices according to the present invention, which is applied to a piezoelectric device and surface acoustic wave device in the above-described embodiments, may be applied to other electronic parts.

What is claimed is:

1. A piezoelectric oscillation device comprising:
   an insulating substrate;
   conducting layers formed on the insulating substrate and opposed to each other at such a distance that the conducting layers are insulated from each other, the conducting layers lying in one plane:
   a dielectric film formed on that portion of the insulating substrate so as to cover a portion of the conducting layers and having a higher dielectric constant than the insulating substrate; and
   a piezoelectric oscillator connected to the conducting layers on an exposed portion of the conducting layers which is not covered by the dielectric film, whereby the opposed conducting layers and the dielectric film constitute a capacitance.

2. A piezoelectric oscillation device according to claim 1, further comprising conducting layers of a predetermined length for inductance formed on the insulating substrate and connected to said conducting layers.

3. A piezoelectric oscillation device according to claim 1, wherein
a dielectric constant of the dielectric film is above 50.

4. A piezoelectric oscillation device according to claim 1, wherein
a Curie point of the dielectric film is near room temperature.

5. A piezoelectric oscillation device according to claim 1, wherein
the conducting layers includes a plurality of pairs of electrode layers opposed to each other at a certain distance, and a connection layer which commonly connects the electrode layers of said plurality of pairs;
the dielectric film is formed so that connections between the said plurality of electrode layers and the connection layer are not covered by the dielectric film; and
said capacitance is adjustable by cutting off some of the connections between said plurality of pairs of electrode layers and the connection layer.

6. A surface acoustic wave device comprising:
an insulating substrate;
conducting layers formed on the insulating substrate and opposed to each other at such a distance that the conducting layers are insulated from each other, the conducting layers lying in one plane;
a dielectric film formed on that portion of the insulating substrate so as to cover a portion of the conducting layers and having a higher dielectric constant than the insulating substrate; and
a surface acoustic wave device chip connected to the conducting layers on an exposed portion of the conducting layers which is not covered by the dielectric film,
whereby the opposed conducting layers and the dielectric film constitute a capacitance.

7. A surface acoustic wave device according to claim 6, further comprising conducting layers of a predetermined length for inductance formed on the insulating substrate and connected to said conducting layers.

8. A surface acoustic wave device according to claim 6, wherein
a dielectric constant of the dielectric film is above 50.

9. A surface acoustic wave device according to claim 6, wherein
a Curie point of the dielectric film is near room temperature.

10. A surface acoustic wave device according to claim 6, wherein
the conducting layers includes a plurality of pairs of electrode layers opposed to each other at a certain distance, and a connection layer which commonly connects the electrode layers of said plurality of pairs;
the dielectric film is formed so that connections between the said plurality of electrode layers and the connection layer are not covered by the dielectric film; and
said capacitance is adjustable by cutting off some of the connections between said plurality of pairs of electrode layers and the connection layer.

11. The piezoelectric oscillation device of claim 1, wherein
said conducting layers include first and second conducting layers, and said exposed portion of the conducting layers includes a first exposed elongated portion of said first conducting layer and a second exposed elongated portion of said second conducting layer, thereby allowing different types of piezoelectric oscillators to be connected to the conducting layers.

12. The piezoelectric oscillation device of claim 11, wherein
said first and second conducting layers are T-shaped with bases of the T-shaped conducting layers forming said exposed portion.

13. The piezoelectric oscillation device of claim 12, wherein
said conducting layers include a third conducting layer which is H-shaped, and said bases of the T-shaped conducting layers positioned to be surrounded by H-shaped third conducting layer.

14. The piezoelectric oscillation device of claim 13, wherein
said dielectric film is H-shaped and positioned to coincide with the H-shape of said third conducting layer to cover a majority of said third conducting layer.

15. The surface acoustic wave device of claim 6, wherein
said conducting layers include first and second conducting layers, and said exposed portion of the conducting layers includes a first exposed elongated portion of said first conducting layer and a second exposed elongated portion of said second conducting layer, thereby allowing different types of piezoelectric oscillators to be connected to the conducting layers.

16. The surface acoustic wave device of claim 15, wherein
said first and second conducting layers are T-shaped with bases of the T-shaped conducting layers forming said exposed portion.

17. The surface acoustic wave device of claim 16, wherein
said conducting layers include a third conducting layer which is H-shaped, and said bases of the T-shaped conducting layers positioned to be surrounded by H-shaped third conducting layer.

18. The surface acoustic wave device of claim 17, wherein
said dielectric film is H-shaped and positioned to coincide with the H-shape of said third conducting layer to cover a majority of said third conducting layer.

* * * * *